United States Patent [19]

McLaughlin et al.

[11] 3,999,061
[45] Dec. 21, 1976

[54] RADIANT ENERGY INTEGRATING METER

[75] Inventors: Neil B. McLaughlin, Swift Current; John R. Allan, Lethbridge, both of Canada

[73] Assignee: Canadian Patents and Development Limited, Ottawa, Canada

[22] Filed: Apr. 30, 1975

[21] Appl. No.: 573,247

[52] U.S. Cl. .............................. 250/214 R; 356/215
[51] Int. Cl.² ........................................ H01J 39/12
[58] Field of Search .......... 250/211 K, 214 P, 214, 250/209, 209 X; 356/213, 215, 218, 216, 221, 222; 307/311; 328/2

[56] References Cited

UNITED STATES PATENTS

| | | | |
|---|---|---|---|
| 2,798,965 | 7/1957 | Goldfischer | 356/218 |
| 3,574,443 | 4/1971 | Nanba | 356/215 |
| 3,727,526 | 4/1973 | Hinds | 250/214 P |
| 3,732,491 | 5/1973 | Battista | 356/215 |
| 3,772,517 | 11/1973 | Smith | 250/209 |

*Primary Examiner*—David C. Nelms
*Attorney, Agent, or Firm*—Edward Rymek

[57] ABSTRACT

A radiant energy integrating meter having one or more parallel connected reversed biased radiant energy sensor cells connected to an integrating circuit having an integrating capacitor. A trigger circuit having a differential amplifier, connected to the integrating capacitor, which drives a further amplifier, is adapted to close a first switch such as a silicon controlled rectifier in response to a predetermined integrated sensor current. A counter circuit is coupled to the first switch and advances by one each time the first switch is closed. A second switch such as a relay is coupled to the first switch to provide a discharge path for the integrating capacitor. Finally, a delay circuit is coupled across the first switch to open the first switch after a predetermined time delay.

6 Claims, 2 Drawing Figures

RADIANT ENERGY INTEGRATING METER

This invention is directed to a digital radiant energy integration and in particular to a compact, low cost and low power consumption radiant energy meter capable of measuring incident radiant energy over long periods of time in a variety of locations.

Energy for the synthesis of plant tissues is provided largely by electromagnetic radiation in the wavelength band of 440 to 740 nm. A measure of incident radiant energy in this band width is useful in physiological studies on plant growth. Since radiant energy reaching the earth's surface varies with atmospheric conditions, a cumulative measure of energy received over a period of time is more useful than an instantaneous measurement.

Several radiant energy meters and integrators have been developed for studying plant growth. Daynard et al. (Daynard, T. B., R. B. Hunter, J. W. Tanner and L. W. Kannenberg 1969). An inexpensive integrating light meter for field crop research. Can. J. Plant Sci. 49 (3): 231–234) describe a simple low cost space integrating light meter to measure the average instantaneous light intensity in a plant canopy. The device consists of 10 selenium photo cells mounted on a probe and connected in parallel. Readout is on a microammeter. Allan and Fuhrer (Allan, J. R. and R. G. Fuhrer. 1972. Radiometer for aquatic use. Can. J. Plant Sci. 52 : 405–408) describe a radiometer for aquatic use. The sensor, a silicon diffused photo diode, is sealed in a plastic holder and can be mounted under water. The output is recorded on a strip chart recorder and time integration can be accomplished by manually integrating the chart recording with a planimeter. Brach and Mack (Brach E. J. and A. R. Mack. 1967. A Radiant Energy Meter and Integrator for Plant Growth Studies, Can. J. Botany, 45:2081–2085) describe a radiant energy integrator which employs an Eppley pyranometer as a sensor and a dc integrating motor connected to a mechanical counter to perform time integration. Brach and Mason (Brach E. J. and W. J. Mason 1971, A digital radiant energy integrator. Laboratory Practice 20(4)) developed an integrator employing a 50 junction Eppley pyroheliometer as a sensor and an operational amplifier with a capacitor feedback to perform the integration. Each time the capacitor charge reaches a predetermined level, it discharges through a four-layer diode and advances an electronic counter by one digit. Although the Eppley pyroheliometer measures total radiant energy with a high degree of precision, it is a delicate instrument. Brach et al. (Brach E. J., G. F. St. Armour and W. J. Mason. 1970. A three channel integrating photometer. Can. Agr. Eng. 12(1): 52–54) describe a three-channel integrating photo meter which employs selenium photo detectors. An operational amplifier with a capacitor feedback performs the integration and the information is stored on electromechanical counters. The power requirements limit its usefulness to areas where a 110-volt supply is available. Several radiant energy integrators suitable for field use are available commercially, but cost and sensor size frequently limit their usefulness.

It is therefore an object of this invention to provide an improved radiant energy integrating meter.

It is a further object of this invention to provide a radiant energy integrating meter capable of integrating radiant energy over an indefinite period.

It is another object of this invention to provide a radiant energy integrating meter capable of providing the sum of the time integral of radiant of a predetermined number of points in space.

It is a further object of this invention to provide a radiant energy integrating meter responding linearly to a wide range of light levels due to environmental conditions.

These and other objects are achieved in a radiant energy integrating meter in accordance with this invention which includes at least one reverse biased radiant energy sensor means for providing a current proportional to impinging radiant energy; integrating circuit means including a capacitor means connected in series with the sensor means to integrate the sensor current; first switch means trigger circuit means coupled between the first switch means and the integrating circuit means to close the first switch means in response to a predetermined integrated current; counter means coupled to the first switch means to advance the count in the counter means in response to the closing of the first switch means; second switch means coupled to the integrating circuit means for providing a discharge path for the capacitor means in response to the closing of the first switch means; and delay means for opening the first switch after a predetermined time delay.

The capacitor means may include a plurality of capacitors of differing values, and a selector switch for connecting a selected one of the capacitors to the reverse biased radiant energy sensor means, and the second switch may be a relay having a coil connected to the first switch means, with first and second contacts connected between the capacitor means and ground.

In addition, the first switch means may be a semiconductor switch such as a silicon controlled rectifier; the trigger circuit means may include a first and second transistor connected as a differential amplifier with the gate of the first transistor connected to the capacitor means and the gate of the second transistor being connected to ground, and an amplifier means connected between the differential amplifier and the semiconductor switch means, the first transistor driving the amplifier means to close the semiconductor switch means; and the delay means may include a monostable multivibrator to provide a negative voltage across the semiconductor switch to turn it off.

Figures 1, 2:
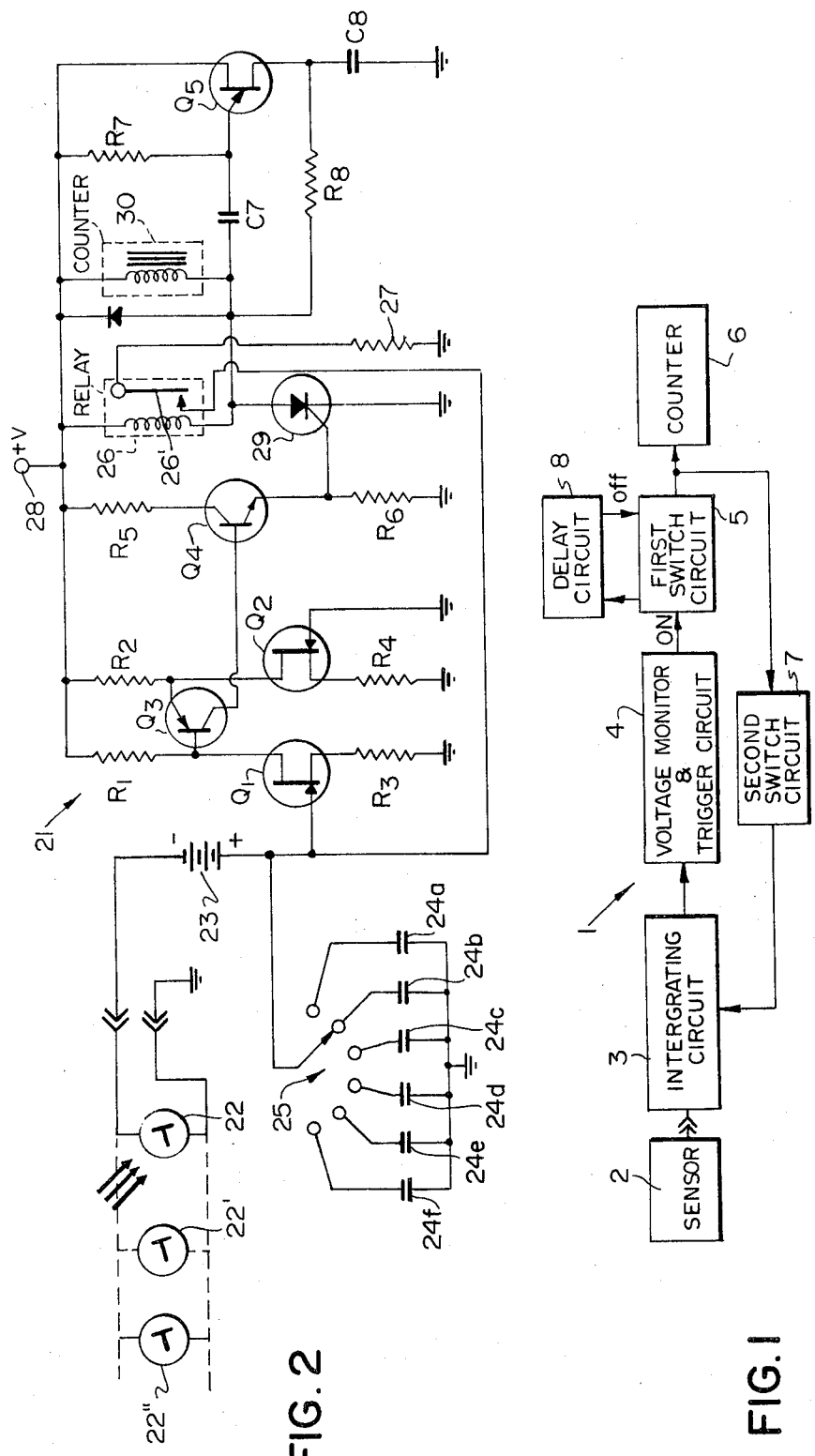
FIG. 1 is a block diagram of the radiant energy integrating meter.
FIG. 2 is a schematic diagram of a radiant energy integrating meter in accordance with this invention.

The radiant energy integrating meter 1 illustrated in FIG. 1 consists of a miniature sensor 2, a battery power supply (not shown), a capacitor integrating circuit 3 which integrates the sensor current, a voltage monitor and trigger circuit 4 which responds to a predetermined voltage across the integrating capacitor, a first switch 5 which closes when fired by a trigger circuit 4 to advance the count in a counter 6 and to activate a second switch 7 which provides a discharge path for the integrating capacitor in integrating circuit 3. In addition, a delay circuit 8 is adapted to open first switch 5 a predetermined time after it is closed.

The sensor 2 may be mounted on the instrument box which includes the other instrument components, however it is preferred to connect the sensor 2 to the integrating circuit 3 by means of a lead of suitable length such that it may be remotely mounted in a permanent location, on a portable probe, on a plant leaf, or under water. The sensor is chosen on the basis of wide spectral response relative to cost and should have a good sensitivity in the 440 to 740 nm band where the principal plant photochemical reactions take place. It should also provide a linear response to incident radiant energy and have small physical dimensions to permit versatility in mounting. One such sensor is the miniature silicon blue photo voltaic cell — Sharp Electronics SBC - 2020.

With reference to the schematic diagram in FIG. 2 of a radiant energy integrating meter 21 in accordance with this invention, the sensor cell 22 is connected in series with a voltage supply 23 and one of the integrating capacitors 24a, 24b, ... such that the sensor 22 is reversed biased, thus a sensor current which is proportional to the light intensity but with is substantially constant irrespective of reverse bias variations, is obtained. Current from the sensor 22 is fed directly to the appropriate integrating capacitor 24a, 24b, 24c, ... which has been selected by the rotary range switch 25 to provide a suitable calibration constant for the intensity of the radiation to be measured. As the sensor cell 22 current charges up a particular capacitor, such as 24b, the reverse bias on the cell 22 reduces from the initial voltage 23 by an amount equal to the voltage increase across that particular capacitor which continues to increase up to a predetermined level to fire the trigger circuit. For a sensor cell 22 of the Sharp Electronics type, it has been found that for a given light intensity, a negligible current variation was observed for a voltage supply 23 of 3 volts and a voltage of 2.7 volts across the integrating capacitor. This feature permits the sensor 22 output to be integrated directly on capacitor 24b without the use of an operational amplifier. This eliminates drift problems and permits time integrations to be made over a wide range of intensities. Also, time integrals of several points in space may be summed by connecting several cells shown as 22' 22'' ... in parallel and mounting them at appropriate points in space. The number of cells that can be used in this manner is limited only by the size of the integrating capacitor and the current capacity of the capacitor discharge system.

To discharge the integrating capacitor 24b, 10, 20, and 30 contacts 26' in a relay 26 are closed to complete a circuit from the integrating capacitor 24b to ground through a resistor 27. The next integrating cycle commences when the relay contacts 26' open.

In the triggering circuit, transistors $Q_1$ and $Q_2$ with their associated source resistors $R_3$ and $R_4$ and drain resistors $R_1$ and $R_2$ form a high impedance differential amplifier which monitors the voltage on the integrating capacitor 24b. Transistors $Q_1$ and $Q_2$ are preferably a matched pair of N channel junction field effect transistors which are 10, 20, and 30 packaged in a single case to provide temperatures stability and which have low gate currents resulting in negligible current drain from the integrating capacitor 24b.

The drain to source current, $I_{DS}$, for transistors $Q_1$ and $Q_2$ is determined by the individual transistor characteristics and the gate to source voltage $V_{GS}$. Since the gate of $Q_2$ is connected to ground, $$V_{GS2} = -I_{DS2} R_4$$

Thus, the source resistor $R_4$ both determines $I_{DS}$ and provides negative feedback which stabilizes $I_{DS}$ 10, 20, and 30 against changes in transistor characteristics with temperature.

The gate of $Q_1$ floats with the voltage across the integrating capacitor, $V_{24b}$, thus $$V_{GS1} = V_{24b} - I_{DS1} R_3$$

As the integrating capacitor 24b charges up, $V_{GS1}$ increases, $I_{DS1}$ increases, resulting in an increasing voltage drop across drain resistor $R_1$. When this voltage drop is greater than that across $R_2$, the emitter base junction of a transistor $Q_3$ becomes forward biased and $Q_3$ begins to conduct. Collector current from $Q_3$ is amplified by a transistor $Q_4$. Emitter current from $Q_4$ is fed to the gate of a silicon controlled rectifier 29 and when it reaches sufficient magnitude the SCR 29 fires.

It is preferable to have $R_1$ equal to $R_2$ and therefore $R_3$ larger than $R_4$, then $V_{24b}$ must be at some potential above ground for equal $V_{GS}$, hence equal $I_{DS}$ for $Q_1$ and $Q_2$. The ratio $R_3$ to $R_4$ is chosen to give equal $I_{DS}$ for $V_{24b}$ equal to approximately 2.7 volts. By using relatively large source resistors, the operating point for $I_{DS}$ is set at about 7 microamps resulting in a low current drain on the voltage supply 28.

$R_1$ and $R_2$ should be of a value such that both $Q_1$ and $Q_2$ are operated in the nonsaturated region and therefore the voltage drops across $R_1$ and $R_2$, and hence the level at which the circuit triggers is not affected by normal supply voltage variations. It is also preferable to have drain resistor $R_1$ larger than source resistor $R_3$ to give a voltage gain for the amplifier. This reduces the effects of variations in emitter base voltage drop in $Q_3$ and current gain in $Q_3$ and $Q_4$ on the triggering level of the circuit. The differential arrangement and equal valued drain resistors in the amplifier, provide excellent temperature stability.

The SCR 29 and uninjunction transistor $Q_5$, along with capacitors $C_7$ and $C_8$ and resistors $R_7$ and $R_8$, form a monostable multivibrator. When triggered, the multivibrator provides pulse approximately 50 ms in width to both a counter 30 and the relay 26. Triggering occurs when the emitter current of $Q_4$ reaches the gate turn on current for SCR 29. The SCR 29 is similar to an open switch when it is in the off state but when it is turned on, it shorts one terminal of both the counter 30 and relay 26 to ground, thereby providing the supply voltage 28 across them. This advances the counter 30 by one count and closes the relay 26 contacts 26' providing a discharge path for the integrating capacitor 24b through resistor 27 to ground. The resetting of the integrating capacitor 24b to ground removes gate current to the SCR 29.

Once the SCR 29 is turned on, it will remain on until anode to cathode voltage is dropped to zero. This is performed by $Q_5$ about 50 ms after the SCR 29 is turned on.

Initially, all three terminals of $Q_5$, are sitting at supply voltage 28. When the SCR 29 turns on, the emitter of $Q_5$ coupled to the SCR 29 anode by $C_7$, drops to the anode on-voltage of about 0.7 volts. $C_8$ discharges through $R_8$ lowering base $_1$ of $Q_5$ to about 3 volts and $C_7$ charges up through $R_7$. When the emitter-base $_1$ voltage, $V_{EB}$, of $Q_5$ reaches the product of its intrinsic stand-off ratio, $\eta$, and the base$_2$ to base$_1$ voltage, $V_{BB}$, $Q_5$ fires entering a state of negative resistance between the emitter and base$_1$. This creates an ac short from the emitter to ground through $C_8$ resulting in a rapid and substantial drop in emitter voltage. Since the emitter is coupled to the SCR 29 anode through $C_7$, the anode voltage drops by the same amount. This passes the SCR 29 anode to cathode voltage through zero turning it off. Once the SCR 29 is turned off, it will remain off until sufficient current is supplied to the gate to turn it on. The dc path to ground is blocked by the SCR 29 in its off state and $C_8$ charges up reaching a steady state value equal to the supply voltage 28.

The standby current for multivibrator is extremely small, being equal to the leakage currents through $C_8$ and the SCR 29. Due to the stability of the intrinsic stand-off ratio for uninjunction transistor $Q_5$, the pulse width is little affected by variations in temperature or supply voltage 28.

We claim:

1. A radiant energy integrated meter comprising:

integrating circuit means including capacitor means;

reverse biased radiant energy sensor means connected in series with said capacitor means, said sensor means providing a current which is proportional to impinging radiant energy and which is constant for constant impinging radiation thereby linearly charging said capacitor means;

trigger circuit means including a differential amplifier coupled to said integration circuit means for applying a triggering signal to a first switch means to close said first switch means in response to a predetermined voltage across said capacitor means;

counter means coupled to said first switch means such that the count in the counter means is advanced in response to each closing of said first switch means to maintain a count of the closing over a period of time;

discharge circuit means connected across said capacitor means for providing a discharge path for said capacitor means, said discharge circuit means including a second switch means coupled to said first switch means to close said discharge path in response to the closing of said first switch means; and delay means for opening said first switch means after a predetermined time delay.

2. A radiant energy integrating meter as claimed in claim 1, wherein said sensor means includes at least two sensor cells connected in parallel by leads of suitable length such that the cells may be positioned at different locations.

3. A radiant energy integrating meter comprising:

reverse biased radiant energy sensor means for providing a constant current proportional to impinging radiant energy;

integrating circuit means including capacitor means connected in series with said sensor means to integrate said sensor current;

trigger circuit means including a first and second field effect transistor connected as a differential amplifier, the gate of said first transistor being connected to said capacitor means and the gate of said second transistor being connected to ground, and amplifier means having an input terminal coupled to said differential amplifier and an output terminal coupled to a gated semiconductor switch means, such that said first transistor drives said amplifier means to close said gated semiconductor switch means in response to a predetermined across said capacitor means;

counter means coupled to said gated switch means such that the count in the counter means is advanced in response to each closing of said gated switch means to maintain a count of the closings over a period of time;

discharge circuit means connected across said capacitor means for providing a discharge path for said capacitor means, said discharge circuit means including a second switch means coupled to said gated switch means to close said discharge path in response to the closing of said gated switch means; and delay means for opening said gated switch means after a predetermind time delay.

4. A radiant energy integrating meter as claimed in claim 3 wherein said second switch means includes a relay having a coil connected in series with the gated semiconductor switch means and normally open first and second contacts controlled by said coil to close the discharge path connecting said capacitor means to ground.

5. A radiant energy integrating meter as claimed in claim 4 wherein said gated semiconductor switch means is a silicon controlled rectifier.

6. A radiant energy integrating meter as claimed in claim 5 wherein said delay means include a monostable multivibrator connected to the silicon controlled rectifier for applying a negative voltage across the silicon controlled rectifier a predetermined time after the silicon controlled rectifier is gated on, to render the silicon controlled rectifier non-conducting.

* * * * *